United States Patent [19]

Vermeers

[11] 4,161,691
[45] Jul. 17, 1979

[54] MULTI-PURPOSE DIGITAL MEASURING APPARATUS

[75] Inventor: Stanley L. Vermeers, La Jolla, Calif.

[73] Assignee: The United States of America as represented by the Secretary of the Navy, Washington, D.C.

[21] Appl. No.: 883,543

[22] Filed: Mar. 6, 1978

[51] Int. Cl.$^2$ .................... G01R 19/26; G01R 27/02; G04F 8/00

[52] U.S. Cl. .................................. 324/120; 324/62; 324/99 D; 324/115; 324/186

[58] Field of Search ...................... 324/120, 115, 73 R, 324/186, 99 D, 62

[56] References Cited

U.S. PATENT DOCUMENTS

| | | | |
|---|---|---|---|
| 2,575,759 | 11/1951 | Higinbotham et al. | 324/186 |
| 3,064,193 | 11/1962 | Grubb et al. | 324/120 |
| 3,978,402 | 8/1976 | Ryder | 324/99 D |

*Primary Examiner*—Rudolph V. Rolinec
*Assistant Examiner*—Ernest F. Karlsen

*Attorney, Agent, or Firm*—Richard S. Sciascia; Ervin F. Johnston; James O. Skarsten

[57] ABSTRACT

Apparatus for selectively measuring voltage, resistance, and time duration of an event, each of which is associated with an electrical network, includes a device for providing a first train of digital pulses, the frequency of the pulse train being related to an analog voltage coupled thereto. The measuring apparatus also includes a clock for generating a second train of digital pulses of fixed frequency, and a constant current source to be coupled to a resistive element being measured by the apparatus. The apparatus further includes counters selectively receiving one of the digital pulse trains for counting the number of pulses received during a selected time period, and for providing a digital output in which the value of a quantity measured by the apparatus is encoded. A display coupled to the counter provides a visible numerical display of a measured value at the conclusion of the selected time period, and control means couples a plurality of binary control signals to the counters to determine the duration of each time period.

12 Claims, 6 Drawing Figures

MULTI-PURPOSE DIGITAL MEASURING APPARATUS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention disclosed and claimed herein pertains generally to a unitized digital meter for selectively measuring unknown values of voltage, resistance and the time duration of an event. More particularly, the invention pertains to a meter of the above type which is of sufficient light weight and compactness to be included as part of a portable test set which is employed to measure multiple parameters or physical quantities associated with an electrical equipment. Even more particularly, the invention pertains to apparatus for selectively measuring a voltage, resistance, or time in response to a set of external binary instructions, and for providing the measured value of a quantity in the form of a digital code.

In order to test the operability of certain electrical or electronic equipments, it is necessary to sequentially measure the values of various parameters or physical quantities associated with the equipments. For example, to determine whether or not a certain Navy missile system is in operable condition, it is necessary to make in excess of 20 discrete measurements of various physical quantities. A number of these measurements are to determine voltage and resistance at different points, and the time duration of certain events, such as the time elapsing between two voltage pulses.

Meters for measuring each of the quantities voltage, resistance and time are of course well known to those skilled in the art. However, it would be extremely advantageous to test the operability of the above missile system in a field location, and a combination of conventional meters for measuring the quantities voltage, resistance and time may be too bulky, fragile, temperature sensitive, or cumbersome to include in a portable test set.

In a test set for making a large number of measurements associated with electrical or electronic equipment it is clearly advantageous to minimize the operator involvement required to obtain the measurements. This advantage may be realized by including a digital system in the test set which provides a set of binary instructions to the test set, whereby a succession of measurements are made automatically. Conventional meters for determining voltage, resistance and time may be unadaptable for control by such binary instructions, and may be unable to provide, without substantial alteration, a measured value in the form of a coded digital signal.

SUMMARY OF THE INVENTION

The present invention discloses apparatus for selectively measuring the value of one of a plurality of physical quantities associated with an electrical network. The apparatus includes a means for generating a first signal comprising a train of digital pulses when a first one of the physical quantities is measured, the frequency of the first signal being determined by the measured value of the first quantity. The apparatus also includes a means for generating a second signal comprising a train of digital pulses when a second physical quantity is measured, the frequency of the second signal remaining constant, and a means for coupling a selected constant current to the measured electrical network when a third one of the physical quantities is measured. The apparatus further provides a means selectively receiving pulses of either the first or the second signal for providing a digital output in which the value of a quantity measured by the apparatus is encoded, wherein the encoded value is equal to the number of pulses received by such means during a selected time period. The duration of the selected time period is determined by a plurality of binary control signals generated by a control means.

In a preferred embodiment of the invention, useful for selectively measuring voltage, resistance or the time duration of an event, a means for generating a first train of digital pulses is provided for voltage measurement, the frequency of the first train of digital pulses being proportional to the value of a measured voltage. The constant current means is employed in resistance measurements, the constant current means coupling a constant current through the resistor or other resistive element of the electrical network which provides the measured resistance. The embodiment further provides a means for generating a second train of digital pulses when the time duration of an event is measured, the frequency of the second train of digital pulses remaining constant. Also, a means is provided for selecting the first digital pulse train when voltage or resistance is measured, and for selecting the second digital pulse train when time is measured by the apparatus. A counting means receives pulses of the selected digital pulse train, counts received pulses, and couples the value of a given measured quantity, in the form of an encoded digital signal, to an output of the apparatus, wherein the encoded value is equal to the number of pulses counted by the counting means during a selected time period. A control means responsive to a plurality of binary instructions couples a plurality of binary control signals to the counting means to determine the duration of the time period.

The control means of the preferred embodiment usefully includes a first counter control means for causing the counter means to count the number of pulses received during each of a succession of first time periods when the apparatus measures voltage or resistance, so that the time duration of each of the first time periods is equal, and a second counter control means for causing the counting means to count the number of pulses received during a second time period, the duration of the second time period being equal to the time duration of the event.

The preferred embodiment also usefully includes a means for providing a visual numerical display of the value of each quantity measured by the embodiment, and a counting means which comprises a number of counter-latch elements. Each counter-latch element is provided with a counter which is selectively cleared and enabled, and which receives a series of digital pulses for providing successive counter outputs, each of the counter outputs indicating the number of pulses received by the counter at a selected time after the counter has been cleared and enabled. Each counter-latch element is further provided with a latch for coupling successive outputs of the counter to an output of the apparatus when the latch is receiving a release signal, and for coupling a selected one of the counter outputs to the apparatus output upon receiving a hold signal, the selected counter output comprising a digital signal in which one of the digits which represents the value of a quantity measured by the apparatus is encoded.

By employing means for generating the aforementioned first and second trains of digital pulses, together with a means for coupling a constant current to a resistive element of an electrical network, the invention provides apparatus for selectively measuring voltage, resistance and time duration of an event associated with the network, wherein the same counting means and video display means may be used in all three types of measurements. The invention thereby effects an important reduction in size, as well as simplication, of such apparatus, and provides an embodiment which may be very usefully employed in a highly portable set for testing various electrical parameters. An embodiment of the invention may be constructed which does not require a precise voltage reference, which may operate through a temperature range of 0° C. to 70° C., and which may operate six months between calibrations. Such embodiment may also be usefully controlled by external digital circuitry, and provide measured values in digitally encoded form. Having measured values in digital form is particularly useful in a test set which is employed to determine the operability of an electrical or an electronic system, by measuring successive parameters or physical quantities, and which must make a decision in response to each measured value.

OBJECTS OF THE INVENTION

An object of the present invention is to provide a single, unitized apparatus for selectively measuring the voltage, the resistance or the time duration of an event.

Another object is to provide apparatus for selectively measuring voltage, resistance and time, which is readily controlled by an external set of digital or binary instructions.

Another object is to provide a unitized apparatus for selectively measuring voltage, resistance and time wherein a resistance is measured by coupling a constant current through the resistor or other resistive element which produces the resistance.

Another object is to provide apparatus for selectively measuring voltage, resistance and time where each measured value is encoded in a digital signal, and where the apparatus does not require an analog to digital converter.

Another object is to provide a simplified apparatus for measuring voltage, resistance and time which is sufficiently reduced in size and weight to be included in a portable set for testing a number and variety of physical quantities.

Another object of the invention is to provide apparatus which selectively measures the value of a voltage, resistance or the time duration of an event over a selected time period, whereby instantaneous variations in value are averaged out.

Another object is to provide an apparatus for selectively measuring voltage, resistance and time which is sufficiently durable to meet military standards, and provides a visual display and a digital output, the display and the output being periodically reset by external signals.

These and other objects of the invention will become more readily apparent from the ensuing specification taken together with the drawings.

DESCRIPTION OF THE PREFERRED EMBODIMENTS

Figure 1:
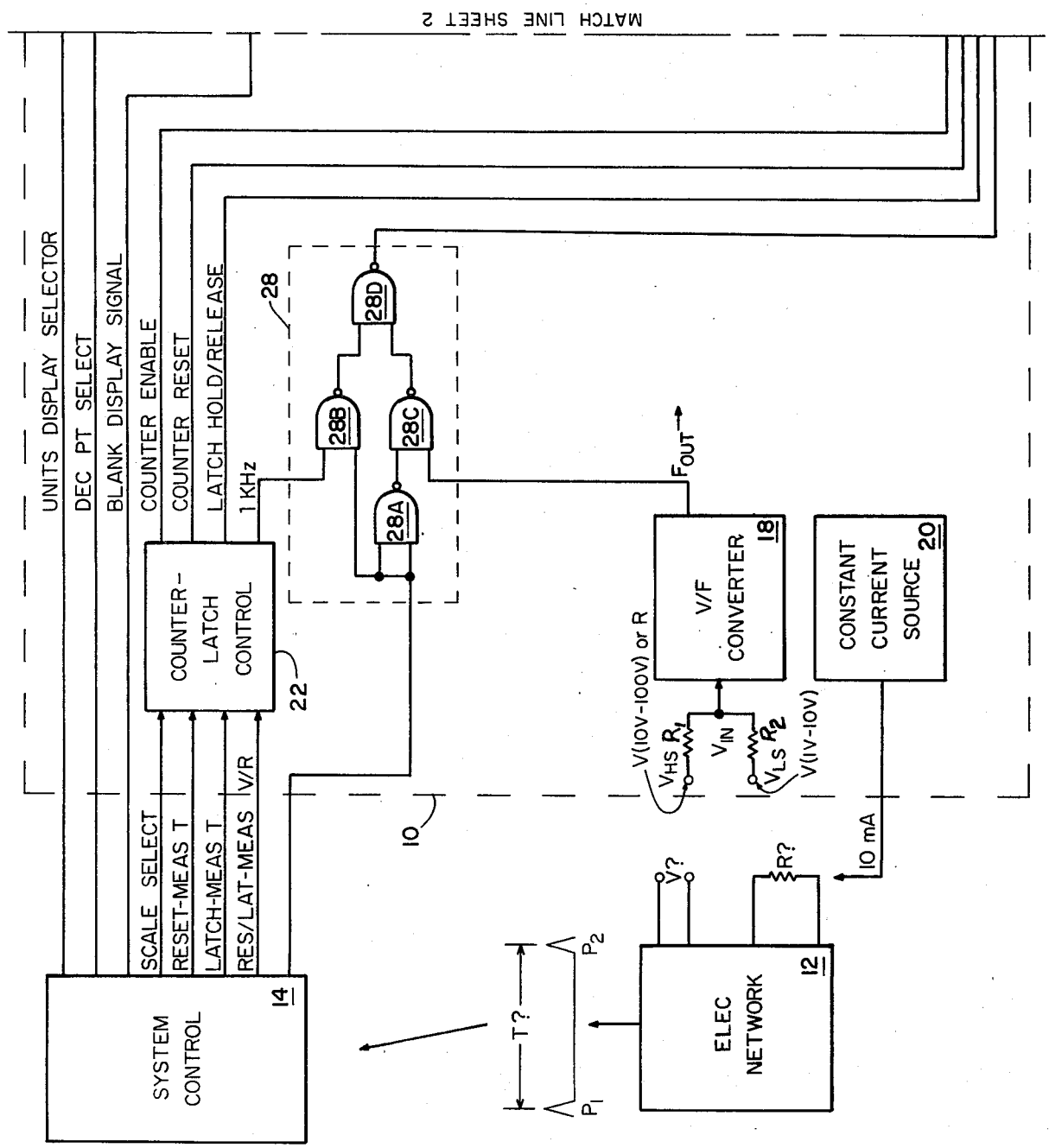
FIG. 1 is a block diagram showing an embodiment of the invention.
Figure 1:
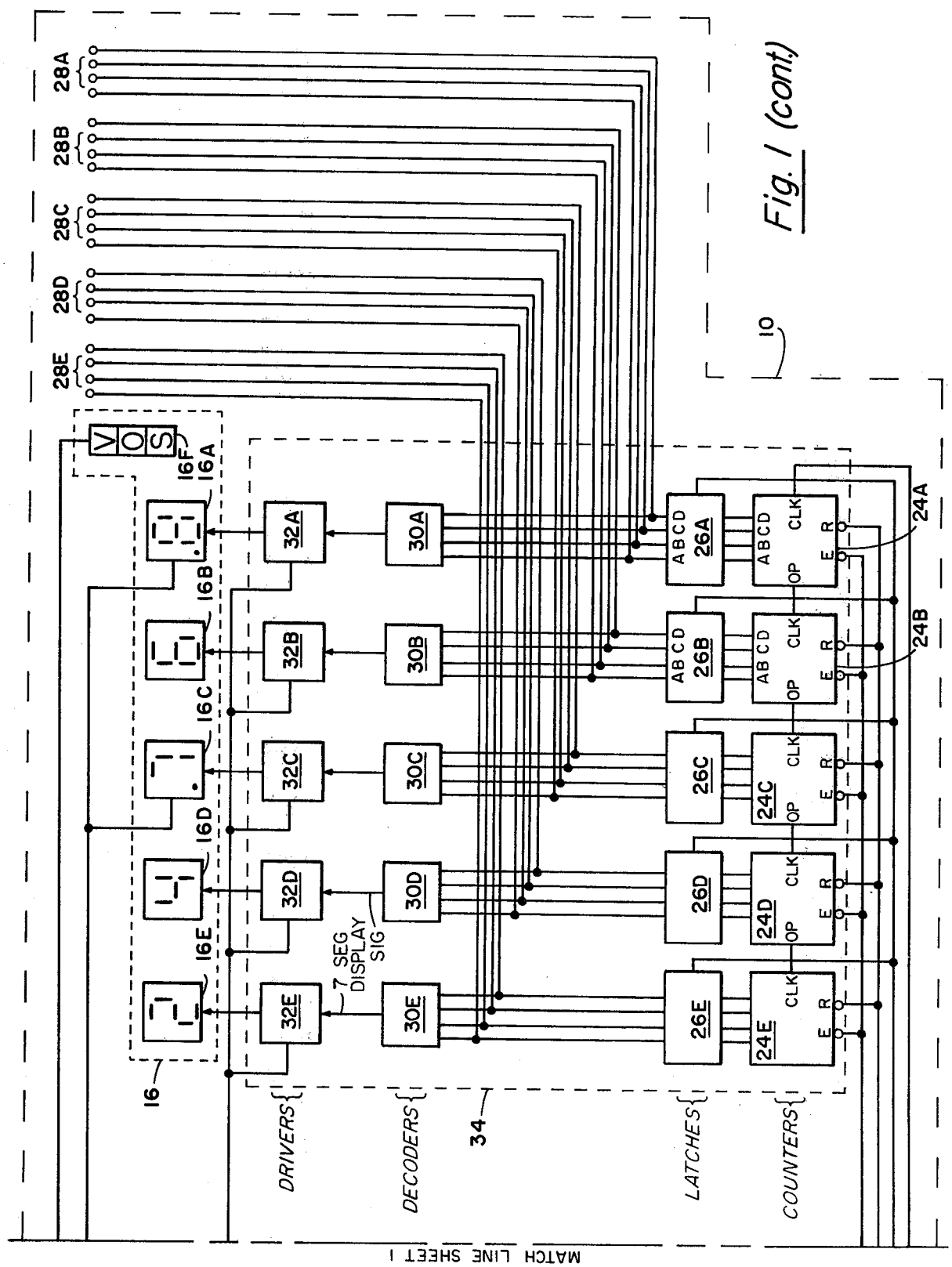

Referring to FIG. 1, there is shown a measurement apparatus 10 which is included in a compact portable test set for determining the operability of electrical network 12, which comprises, for example, the electronics component of the aforementioned missile system. The test set system also includes a system control 14, which couples binary instructions to apparatus 10, apparatus 10 responding thereto by successively measuring one or more analog voltages V, one or more resistances R, and the time durations of one or more events. All of such electrical quantities are associated with electrical network 12, and the respective values thereof must be measured to determine whether or not network 12 is in operable condition. System control 14 may include a programmed microprocessor which instructs apparatus 10 to perform the above measurements in a selected succession. An event of time duration T may comprise, for example, the time elapsing between two voltage pulses $P_1$ and $P_2$.

Apparatus 10 is provided with numerical visual display 16, comprising seven-segment display elements 16A-16E and unit display element 16F, for representing a measured value of voltage in volts, a measured value of resistance of ohms, and a measured value of time in seconds. The unit of the measured value is displayed by element 16F, in response to a unit select signal from system control 14, and each digit representing the measured value is displayed by one of the display elements 16A-16E. It is anticipated that all measured voltages of network 12 will be less than 100 volts, and all measured times will be less than 100 seconds. Consequently, display 16 shows measured values of voltage and time to three decimal places, display element 16C displaying a decimal point in response to a decimal select signal from system control 14. Similarly, it is anticipated that all measured values of resistance will be less than 1100.0 ohms, and display 16 shows values of resistance to one decimal place. When apparatus 10 measures resistance, display element 16A displays a decimal point in response to a decimal select signal.

Referring further to FIG. 1, there is shown apparatus 10 including a voltage to frequency converter 18, which receives an analog input voltage and responds thereto by generating a train of digital pulses having a frequency which is directly proportional to the input voltage. Converter 18 is a conventional device comprising, for example, a Teledyne-Philbrick V/F converter, No. 470903. To measure voltage anticipated to be in the range 0 V.—100 V., the voltage is applied to a high-scale voltage terminal $V_{hs}$, which is coupled to $R_1$. $R_1$ is selected so that an applied voltage of 100 V. generates a train of pulses of 100 KHz. Similarly, if a voltage is anticipated to be in the range 0 V.—10 V., it is applied to low-scale voltage terminal $V_{ls}$. $R_2$, coupled thereto, is selected so that an applied voltage of 10 V. generates a train of pulses of 10 KHz. It will be readily appreciated that by providing for alternative high-scale and low-scale voltage measurements, apparatus 10 measures and displays a voltage in the low-scale range with 10 times the resolution of the voltage in the high-scale range, while employing the same measurement and display components.

FIG. 1 also shows apparatus 10 including constant current source 20, which is coupled to network 12 to pass a selected constant current through the resistor or other resistive element of network 12 which generates a measured resistance R. The voltage across the resistor is applied to the $V_{hs}$ terminal of converter 18 to provide a train of digital pulses having a frequency which is directly proportional to the value of R. Current source 20 provides a constant current of 10 milliamps. Consequently, given the well known proportional relationship between a resistance and the voltage there across, apparatus 10 is able to employ the same components for measuring and displaying voltages in a range limited by 100 V, and resistances in a range limited by 1100.0 ohms.

To measure a given quantity, system control 14 couples a set of binary instructions to counter-latch control 22. In response thereto, control 22 generates binary control signals comprising counter enable and counter reset signals, which are respectively coupled to the enable and reset terminals of each of the counters 24A-24E. Control 22 also generates either a latch hold or a latch release signal which is coupled to each of the latches 26A-26E, and a digital pulse train having a frequency of 1 KHz.

To measure voltage or resistance, control 14 couples a Reset/Latch instruction to control 22, and additionally, when measuring voltage, couples a scale select signal to control 22, indicating high or low-scale measurement. Also, a voltage and resistance select signal, comprising a logic 0, is coupled to NAND gate 28A of measurement select circuit 28. Circuit 28 further comprises NAND gates 28B-28D and receives both the digital output from converter 18, and the 1 KHz signal from control 22. It will be noted from the interconnection of NAND gates 28A-28D that when a logic 0 is coupled to NAND gate 28A, the digital pulse train generated by converter 18 is coupled to the clock terminal of counter 24A.

To measure time, control 14 couples separate Reset and Latch instructions to control 22, and couples a logic 1 to select circuit 28, whereupon the 1 KHz pulse train from control 22 is coupled to the clock terminal of counter 24A.

Each counter 24A-24E is a decade counter, is enabled by a logic 0 coupled to its enable terminal (E), and is cleared by a logic 0 coupled to its reset terminal (R). Each counter counts the number of pulses, up to ten, received at its clock terminal after being reset and enabled, the number being encoded in Binary Coded Decimal (BCD) form in the outputs A-D of the counter. Upon receiving a tenth clock pulse, the counter generates an output pulse at its OP terminal. Consequently, by coupling the OP terminals of counters 24A, 24B, 24C, and 24D respectively to the clock terminals of counters 24B, 24C, 24D and 24E, respective BCD outputs of the counters together represent the number of pulses received at the clock terminal of counter 24A at a given time after the clearing and enabling of the counters. The BCD output of each counter 24A-24E is coupled to the input of one of the latches 26A-26E.

The output terminals A-D of each latch 26A-26E are respectively coupled to a corresponding apparatus output 28A-28E. When a release signal, comprising a logic 0, is coupled to a latch, successive BCD outputs of the counter coupled thereto are successively applied thereby to the corresponding apparatus output. Upon receiving a hold signal, comprising a logic 1, concurrent with a given BCD counter output, a latch holds the given counter output upon its corresponding apparatus output for the duration of the hold signal.

The output terminals A-D of each latch 26A-26E are also coupled to one of the decoders 30A-30E so that a counter output coupled to an apparatus output 28 is also coupled to one of the decoders. In response to a counter output, a decoder generates a seven segment display signal which represents the number or digit encoded in the counter output. Each seven-segment select signal is coupled, through one of the drivers 32A-32E, to one of the display elements 16A-16E, which thereupon displays the digit represented by the seven segment select signal. Drivers 32A-32E are provided to meet the current requirements of respective seven segment display elements 16A-16E.

Counters 24A-24B, latches 26A-26E, decoders 30A-30E, and drivers 32A-32E together comprise a counting means 34, and each interconnected counter, latch, decoder and driver comprises a counter-latch element. To reduce the number and complexity of components required for apparatus 10, each counter-latch element comprises an integrated circuit, such as IC number SN 74144, manufactured by Texas Instruments Inc. and referred to as a 4-bit counter/latch, seven segment LED/lamp driver.

When it is not necessary for a test set including apparatus 10 to employ display 16, control 14 couples a blank display signal to each driver 32A-32E. Each display element thereupon goes blank, preventing subsequent distraction of a test operator.

Figure 2A:
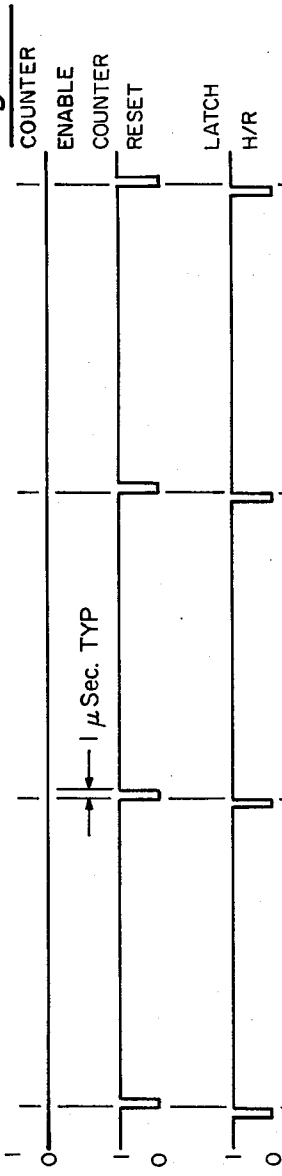
FIGS. 2A-2C are timing diagrams showing binary control signals generated for different modes of operation of the embodiment of FIG. 1, FIG. 2A showing control signals generated in the measurement of high-scale voltage and resistance, FIG. 2B showing control signals generated in the measurement of low-scale voltage, and FIG. 2C showing control signals generated in the measurement of the time duration of an event.
Figure 2B:
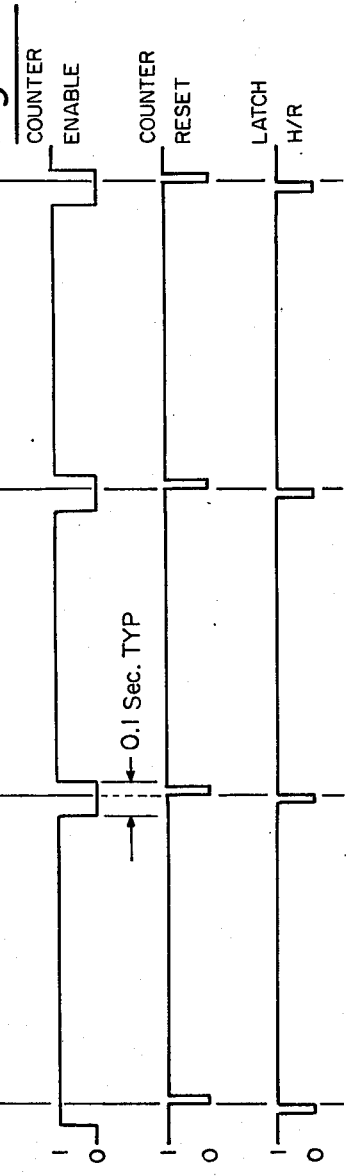
Figure 2C:
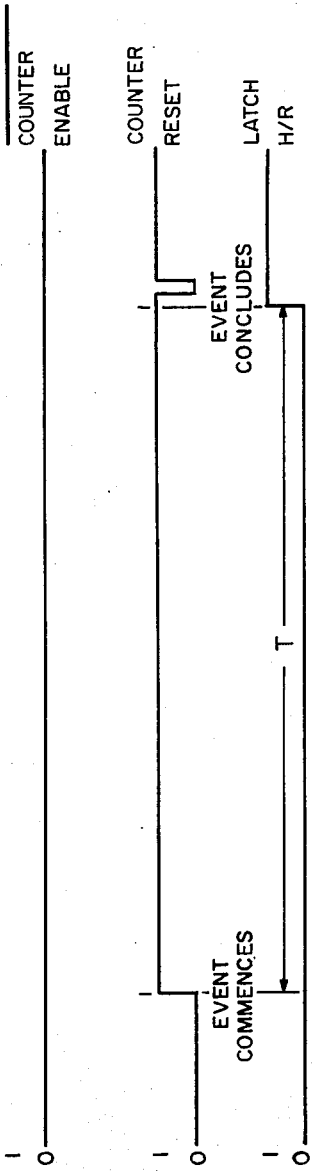

To more clearly understand the operation of apparatus 10 shown in Fig. 1, FIGS. 2A-2C are provided, which illustrate binary control signals coupled to counting means 34 from control 22 for different modes of operation. FIG. 2A illustrates the control signals for measuring high-scale voltage (0 V—100 V), or resistance, FIG. 2B illustrates the control signals for measuring low-scale voltage (0 V—10 V), and FIG. 2C illustrates the control signals for measuring the time duration of an event.

FIG. 2A shows that the counter enable signal provided by control 22 remains at logic 0 throughout the measurement of high-scale voltage or resistance so that each of the counters 24A-24E remains enabled. The counter reset signal coupled to each counter from control 22 clears each counter at the beginning of each of a succession of 1 second time intervals by going to logic 0, and then, after a 1 microsecond interval, returns to logic 1 for the duration of the time period. Given the aforementioned interconnection of counters 26A-26E, the combined outputs thereof at the conclusion of each 1 second time period represent the number of pulses received by counter 24A from converter 18 during the time period.

Since as aforementioned, the frequency of the digital output of converter 18 is proportional to a voltage or resistance coupled thereto, the number of pulses counted by counter 26A–26E during each 1 second time period is equal to the value of such voltage or resistance. For example, if apparatus 10 is employed to measure a resistance of 800 ohms, a 10 milliamp current from constant current source 20 is coupled therethrough to generate a voltage of 8 volts thereacross. This voltage is coupled to converter 18 through resistor $R_1$. As aforementioned, a voltage of 100 V coupled to converter 18 through $R_1$ causes a digital signal of 100 kHz to be generated therefrom. A voltage of 8 volts coupled to converter 18 therefore generates a digital signal of 8 kHz therefrom, and counters 24A–24E receive and count 8000 pulses during each 1 sec time period.

It will be noted that by measuring a value of voltage or resistance over a selected time period, instantaneous variations thereof are averaged out.

Referring further to FIG. 2A, it will be noted that 1 microsecond before the conclusion of each time period, a logic 0 release signal is coupled to each latch 26A–26E from control 22. Respective outputs of the counters, representing a measured value of voltage or resistance, are thereupon coupled in digital form to apparatus outputs 28A–28E, and are also visually displayed by display 16. As the following time period begins, a hold signal is coupled to each of the latches from control 22, so that the measured value will be displayed for the following time period.

FIG. 2B shows that the counter reset and latch hold and release signals generated by control 22 for the measurement of low-scale voltage are identical to the respective signals generated thereby for the measurement of high-scale voltage and resistance. However, the range of frequencies generated by converter 18 for low-scale voltages is ten times the range of frequencies for high-scale voltages. Consequently, the counter enable signal provided by control 22 enables counters 24A–24E to count received pulses only during the final 0.1 second of each 1 second time period, or more accurately, the final 0.1 second less one microsecond.

FIG. 2C shows that the counter enable signal provided by control 22 remains at logic 0 throughout the time duration of an event so that each of the counters 24A–24E remains enabled. Prior to the beginning of the event, the counter reset signal is logic 0, so that each of the counters is cleared. Upon the commencement of the event, the counter reset signal goes to logic 1, allowing pulses subsequently received by the counters to be counted thereby. Just after the conclusion of the event, the counter reset signal falls to logic 0 for 1 microsecond, and the counters are cleared. FIG. 2C further shows that a logic 0 is coupled to each of the latches 26A–26E for the duration of the event. Upon the conclusion of the event, a logic 1 hold signal is coupled to each of the latches, so that the number of pulses counted during the event is held upon apparatus outputs 28A–28E and upon display 16. The hold signal is coupled to the latches before the reset falls for 1 microsecond. Since counting means 34 receives a 1 kHz digital signal when time is being measured by apparatus 10, each pulse received during the event represents a time duration of 1 millisecond.

Figure 3:
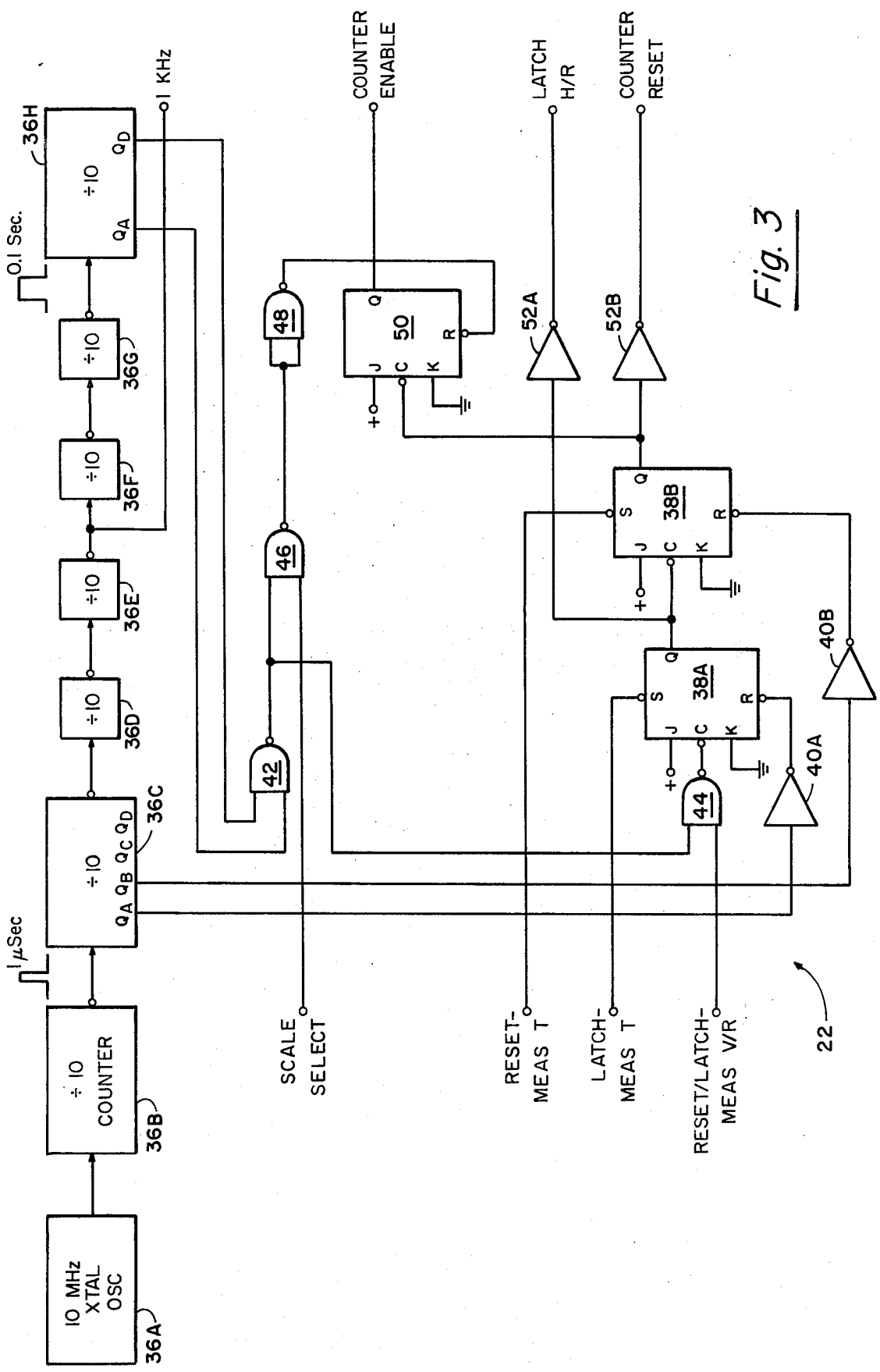
FIG. 3 is a schematic diagram showing a counter-latch control for the embodiment of FIG. 1.

Referring to FIG. 3, there is shown a timing means comprising a 10 MHz crystal oscillator 36A and seven divide by ten counters 36B–36H. The outputs $Q_A$–$Q_D$ of each counter represent the number of pulses received thereby during successive 10—count cycles thereof, in BCD form. Oscillator 36A is coupled to counter 36B, and counters 36B–36H are interconnected so that counter 36C is clocked every microsecond, counter 36H is clocked every 0.1 second, and the output of counter 36E comprises the aforementioned 1 kHz digital pulse train provided by control 22.

The $Q_A$ and $Q_B$ outputs of counter 36C are respectively coupled to the reset terminals of flip flops 38A and 38B, through inverters 40A and 40B. $Q_A$ makes a transition from logic 0 to logic 1 upon the first count of each ten-count cycle of counter 36C, and $Q_B$ makes a logic 0 to logic 1 transition 1 microsecond thereafter.

The $Q_A$ and $Q_D$ outputs of counter 36H provide the inputs to NAND gate 42. The $Q_A$ and $Q_D$ outputs thereof are concurrently at logic 1 only during the ninth count of each ten-count cycle of counter 36H, so that the output of NAND gate 42 is at logic 0 for 0.1 second during each of a succession of 1 second intervals, and makes one logic 0 to logic 1 transition during each 1 second interval. The output of NAND gate 42 is coupled to NAND gate 44 and also to NAND gate 46. The output of NAND gate 46 is coupled to both inputs of NAND gate 48, the output of NAND gate 48 is coupled to the reset terminal of flip flop 50, and the output of flip flop 50 comprises the counter enable signal provided by control 22. The output of flip flop 38A, coupled through inverter 52A, provides the latch hold and release signals, and the output of flip flop 38B, coupled through inverter 52B, provides the counter reset signal.

Referring once more to FIG. 3, the Reset/Latch instruction provided by system control 14 is shown coupled to an input of NAND gate 44. The Latch and Reset instructions are respectively coupled to the set terminals of flip flops 38A and 38B, and the scale select signal provides an input to NAND gate 46.

When apparatus 10 is employed to measure high-scale voltage or resistance, the scale select signal coupled to control 22 is logic 0, whereby the output of NAND gate 46 is held at logic 1, the output of NAND 48 is held at logic 0, and the output of flip flop 50 remains at logic 0, as shown in FIG. 2A. The Reset and Latch instructions are held at logic 1 so that they do not affect the operation of flip flop 38A or 38B. The Reset/Latch instruction is a logic 1, coupled to NAND gate 44, so that NAND gate 44 follows the output of NAND gate 42.

As aforementioned, the output of NAND gate 42 makes a logic 0 to logic 1 transition at 1 second intervals, such transitions occurring upon the tenth count of each ten-count cycle of counter 36H. This transition is coupled through NAND gate 44, and inverted thereby, to clock flip flop 38A. 38A thereupon generates a logic 1 for a 1 microsecond interval. At the conclusion of the 1 microsecond interval, flip flop 38A is reset by the $Q_A$ output from counter 36C, and the output of flip flop 38A returns to logic 0. The 1 microsecond pulse thereby generated from flip flop 38A is inverted by inverter 52A to provide the latch release signal shown in FIG. 2A. Such latch release signals occur at 1 second intervals.

As the output of flip flop 38A returns to logic 0, flip flop 38B is clocked and the output thereof goes to logic 1. As aforementioned, the output of $Q_A$ which resets flip flop 38A is followed, after 1 microsecond, by an output $Q_B$ of counter 36C which resets flip flop 38B. Flip flop 38B therefore also provides a 1 microsecond pulse every 1 second, the conclusion of each pulse from flip flop 38A coinciding in time with the commencement of each pulse from flip flop 38B.

When apparatus 10 is employed to measure a low-scale voltage, the Reset, Latch and Reset/Latch instructions are all logic 1, as in the measurement of high-scale voltage and resistance. However, the scale select signal is also logic 1, whereby NAND gate 46 follows the output of NAND gate 42. Since, as aforementioned, the output of NAND gate 42 is at logic 0 for 0.1 sec during each of a succession of 1 sec time intervals, the output of flip flop 50, the counter enable signal, is also at logic 0 for one tenth of a second during successive 1 second time intervals, as shown by FIG. 2B. It may be noted from FIG. 3 that flip flop 50 is clocked by the falling edge of each 1 microsecond pulse of flip flop 38B.

When apparatus 10 is employed to measure the time duration of an event, the scale select signal from control 14 is logic 0, providing a counter enable signal of logic 0. The Reset/Latch instruction is also at logic 0, disabling NAND gate 44 from clocking flip flop 38A. Prior to the beginning of the event, the Reset instruction is logic 0, so that flip flop 38B is in a set condition and the output thereof is logic 1. The logic 1 output of flip flop 38B is coupled through inverter 52B to the reset terminals of counters 24A–24E, so that each of the counters are cleared when the event commences.

While reset pulses are continually coupled to flip flop 38B, from the $Q_B$ output of counter 36C, the output thereof remains at logic 1 as long as a set signal is coupled thereto. Such effect is a characteristic of the physical element used for flip flop 38B, which may comprise for example an IC 7476. However, when the event to be timed commences, the Reset instruction from control 14 goes to logic 1 in response to the commencement of the event. Thereupon, or within four microseconds thereafter, flip flop 38B is reset by a pulse from $Q_B$.

Prior to and during the event, a Latch instruction of logic 0 sets flip flop 38A, which likewise comprises an IC 7476, so that the inverted output thereof remains at logic 0 despite successive reset pulses coupled thereto from the $Q_A$ output of counter 36C. However, when the event to be timed concludes, the Latch instruction from control 14 goes to logic 1 in response to the conclusion of the event. Thereupon, or within one microsecond, flip flop 38A is reset, the inverted output thereof, coupled to latches 26A–26E, goes to logic 1, and the number of millisecond counts received by counting means 34 during the event is held upon apparatus outputs 28A–28E, and also upon display 16.

As flip flop 38A is reset, flip flop 38B is clocked, and the inverted output thereof falls to logic 0, clearing the counters. However, the timing of the above occurrences is such that latches 26A–26E have sufficient time to hold the counter outputs at the conclusion of the event before the counters are cleared. A pulse from $Q_B$ of counter 36C quickly resets flip flop 38B, returning the counter enable signal to logic 1.

Figure 4:
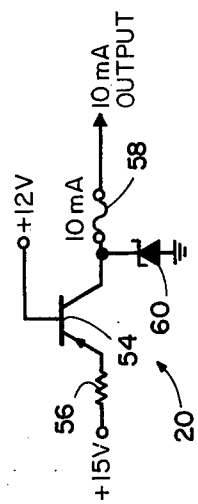
FIG. 4 is a schematic diagram showing a constant current source for the embodiment of FIG. 1.

Referring to FIG. 4, there is shown constant current source 20 including a transistor 54, the base terminal thereof being coupled to a 12 V. bias voltage. A resistor 56 is coupled between the emitter terminal of transistor 54 and a 16 V. bias voltage for establishing a collector current of 10 mA., and a 10 mA. fuse 58 is coupled between the collector terminal of transistor 54 and the output of source 20. A zener diode is coupled between the collector terminal of transistor 54 and ground for preventing the transistor from going into saturation when an infinite resistance is coupled to the output of source 20. The voltage rating of zener diode 60 is 11 V. This prevents the voltage across the measured resistance from being greater than 11 V which is equivalent to a resistance of 1100 ohms. Therefore the maximum measurable resistance is 1100 ohms.

Obviously, many modifications and variations of the present invention are possible in the light of the above teachings, and, it is therefore understood that within the scope of the disclosed inventive concept, the invention may be practiced otherwise than specifically described.

What is claimed is:

1. Apparatus for selectively measuring voltage and time durations of events, said quantities being associated with an electrical network, said apparatus comprising:

first means for generating a first train of digital pulses when a voltage is measured by said apparatus, the frequency of said first train of digital pulses varying according to the value of voltage measured by said apparatus;

second means for generating a second train of digital pulses of selected constant frequency;

means responsive to a first select signal for selecting said first digital pulse train when voltage is measured by said apparatus, and responsive to a second select signal for selecting said second digital pulse train when the time duration of an event is measured by said apparatus;

counting means receiving said selected digital pulse train for providing a digital output signal which represents the number of pulses of said selected digital pulse train which are received by said counting means when said counting means is enabled;

control means responsive to a plurality of binary instructions for coupling said first and second select signals to said selecting means, for enabling said counting means to count received pulses during a succession of time periods of equal time duration when said apparatus is measuring voltage, and for enabling said counting means to count received pulses during a single time period when said apparatus is measuring the time duration of an event.

2. The apparatus of claim 1 wherein said apparatus comprises apparatus for selectively measuring voltage, time durations of events, and the resistance of resistive elements, all of said quantities being associated with an electrical network, and wherein:

said apparatus further comprises means for coupling a selected constant current through a given resistive element of said electrical network to generate a resistance measuring voltage when the resistance of said given resistive element is measured by said apparatus;

said first means comprises means receiving said resistance measuring voltage for generating a third train of digital pulses, the frequency of said third train of digital pulses varying according to said resistance measuring voltage;

said selecting means comprises means for selecting said third train of digital pulses when the resistance of said given resistive element is measured by said apparatus; and said control means comprises means for enabling said counting means to count received pulses during a succession of time periods of equal time duration when said apparatus is measuring the resistance of said given resistive element.

3. Apparatus for selectively measuring voltage and the time duration of an event, said quantities being associated with an electrical network, said apparatus comprising:

first means for generating a first train of digital pulses when a voltage is measured by said apparatus, the frequency of said first digital pulse train varying according to the value of the measured voltage;

second means for generating a second train of digital pulses of selected constant frequency when the time duration of an event is measured by said apparatus;

counting means which includes a number of counter-latch elements and which selectively receives one of said digital pulse trains, each of said counter-latch elements including a counter which is selectively cleared and enabled and which receives a series of digital pulses for providing successive counter outputs, each of said counter outputs indicating the number of pulses received by said counter at a selected time after said counter has been cleared and enabled, and each of said counter-latch elements further including a latch for coupling successive outputs of a counter to an output of said apparatus when said latch is receiving a release signal, and for coupling a selected one of said counter outputs to said apparatus output upon receiving a hold signal; and control means responsive to a plurality of binary instructions for clearing and enabling said counters and for coupling release and hold signals to said latches.

4. The apparatus of claim 3 wherein said apparatus comprises apparatus for selectively measuring voltage, resistance of a resistive element, and the time duration of an event, all of said quantities being associated with an electrical network, and wherein:

said apparatus includes means for coupling a selected constant current through a resistive element of said electrical network when the resistance of said resistive element is measured by said apparatus to generate a resistance measuring voltage across said resistive element which is proportional to the resistance of said resistive element;

said first means comprises means for generating a train of digital pulses which has a frequency proportional to said resistance measuring voltage when the resistance of said resistive element is measured by said apparatus;

said apparatus includes means coupled to said first means and to said second means for selecting a digital pulse train generated by said first means when voltage or the resistance of a resistive element is measured by said apparatus, and for selecting a digital pulse train generated by said second means when the time duration of an event is measured by said apparatus;

each counter of said counter-latch elements comprises a decade counter having an input and an output, the inputs of all of said counters except one being coupled to an output of a different counter, and the input of one of said counters being coupled to said pulse train select means; and each of said counter-latch elements further includes a decoder for providing a display signal.

5. The apparatus of claim 4 wherein:

said apparatus includes visual display means, comprising an array of visual display elements, for displaying a quantity measured by said apparatus, each of said visual display elements receiving a display signal from one of said decoders for displaying a numerical digit.

6. The apparatus of claim 4 wherein:

said digital pulse train select means comprises a means responsive to a measurement select signal for selecting a digital pulse train generated by said first means when said apparatus measures a voltage or the resistance of a resistive element, and for selecting a digital pulse train generated by said second means when said apparatus measures the time duration of an event.

7. The apparatus of claim 6 wherein said control means comprises:

first counter control means for clearing each of said counters at the beginning of each of a succession of first time periods by coupling a reset signal to each of said counters, and for successively coupling a release signal and a hold signal to each of said latches at the conclusion of each of said first time periods, said hold signal following said release signal by a time interval which is very short in comparison with the time duration of said first time intervals;

a second counter control means for coupling a release signal to each of said latches during one of said events of unknown time duration, for coupling a hold signal to each of said latches at the conclusion of said event, and for clearing each of said counters prior to the beginning of said event, and;

a timing means for timing the operation of said control means, said second means comprising a component of said timing means.

8. Apparatus of claim 7 wherein:

said first counter control means includes means for enabling each of said counters to count received pulses only during a segment of each of said first time periods to improve the resolution of a voltage measurement made by said apparatus, said resolution being improved by a factor equal to the time duration of said first time periods divided by said segment.

9. The apparatus of claim 8 wherein:

means are coupled between said decoders and said visual display elements for blanking each of said visual display elements in response to a blanking signal.

10. The apparatus of claim 9 wherein:

one or more of said visual display elements includes means for displaying a decimal point in response to a decimal display signal.

11. The apparatus of claim 4 wherein:

said first means comprises a voltage frequency converter which receives an analog input voltage, and provides a train of digital pulses having a frequency which is directly proportional to said analog input voltage.

12. The apparatus of claim 4 wherein said constant current means comprises:

a transistor, the base terminal of said transistor being coupled through a first bias voltage;

a resistor coupled between the emitter terminal of said transistor and a second bias voltage for establishing a collector current of selected value;

a fuse coupled between the collector terminal of said transistor and the output of said constant current means, said fuse preventing said constant current means from generating an amount of current which succeeds said selected current value; and a zener diode coupled between the collector terminal of said transistor and ground for preventing said transistor from going into saturation when an infinite resistance is coupled to said constant current means.

* * * * *